(12) United States Patent
Takahashi et al.

(10) Patent No.: US 8,171,433 B2
(45) Date of Patent: May 1, 2012

(54) METHOD OF CALCULATING PATTERN-FAILURE-OCCURRENCE-REGION, COMPUTER PROGRAM PRODUCT, PATTERN-LAYOUT EVALUATING METHOD, AND SEMICONDUCTOR-DEVICE MANUFACTURING METHOD

(75) Inventors: Masanori Takahashi, Kanagawa (JP); Toshiya Kotani, Tokyo (JP); Satoshi Tanaka, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 342 days.

(21) Appl. No.: 12/554,495

(22) Filed: Sep. 4, 2009

(65) Prior Publication Data
US 2010/0082144 A1    Apr. 1, 2010

(30) Foreign Application Priority Data

Sep. 26, 2008  (JP) ................. 2008-248785

(51) Int. Cl.
*G06F 17/50* (2006.01)

(52) U.S. Cl. ............... 716/51; 716/50; 716/52; 716/53; 716/54; 716/55; 430/5; 430/30

(58) Field of Classification Search .............. 716/50–56; 430/5, 30
See application file for complete search history.

(56) References Cited

U.S. PATENT DOCUMENTS

| | | | |
|---|---|---|---|
| 6,909,930 B2 * | 6/2005 | Shishido et al. | 700/121 |
| 7,000,215 B2 | 2/2006 | Nakano et al. | |
| 7,243,332 B2 * | 7/2007 | Melvin et al. | 716/51 |
| 7,346,470 B2 * | 3/2008 | Wisniewski et al. | 702/181 |
| 7,484,189 B2 * | 1/2009 | Hofsass et al. | 716/136 |
| 7,674,570 B2 * | 3/2010 | Nagahama et al. | 430/296 |
| 2006/0190912 A1 * | 8/2006 | Melvin et al. | 716/19 |

FOREIGN PATENT DOCUMENTS

| | | |
|---|---|---|
| JP | 1-246833 | 10/1989 |
| JP | 3-35238 | 2/1991 |
| JP | 11-202471 | 7/1999 |
| JP | 2003-162041 | 6/2003 |
| JP | 2006-276260 | 10/2006 |
| JP | 2006-276491 | 10/2006 |

OTHER PUBLICATIONS

Notice of Rejection issued by the Japanese Patent Office on Dec. 21, 2010, for Japanese Patent Application No. 2008-248785, and English-language translation thereof.

* cited by examiner

*Primary Examiner* — Nghia Doan
(74) *Attorney, Agent, or Firm* — Finnegan, Henderson, Farabow, Garrett & Dunner, L.L.P.

(57) ABSTRACT

Method of calculating pattern-failure-occurrence-region comprising calculating a pattern failure occurrence region using relation information and a layout used for forming a convex section, the relation information being a relation between a distance from a formed pattern in a film to cover the convex section on a substrate to the convex section and a region in the film in which a shape of the formed pattern cannot satisfy a predetermined condition because of influence of the convex section.

20 Claims, 8 Drawing Sheets

METHOD OF CALCULATING PATTERN-FAILURE-OCCURRENCE-REGION, COMPUTER PROGRAM PRODUCT, PATTERN-LAYOUT EVALUATING METHOD, AND SEMICONDUCTOR-DEVICE MANUFACTURING METHOD

CROSS-REFERENCE TO RELATED APPLICATIONS

This application is based upon and claims the benefit of priority from the prior Japanese Patent Application No. 2008-248785, filed on Sep. 26, 2008; the entire contents of which are incorporated herein by reference.

BACKGROUND OF THE INVENTION

1. Field of the Invention

The present invention relates to method of calculating pattern-failure-occurrence-region, a computer program product, a pattern-layout evaluating method, and a semiconductor-device manufacturing method.

2. Description of the Related Art

In a lithography process in manufacturing a semiconductor device, after thin organic films such as a processed film, a resist, and a protective film are applied and formed on a wafer substrate, the resist and the protective film are exposed to light and developed to form a resist pattern. In the lithography process, the wafer substrate to which the resist is applied is not always flat depending on a process. For example, when a gate is already formed on the wafer substrate, a step (convex) is formed on the wafer substrate because of a convex shape of a gate electrode formed of polysilicon or the like. In the lithography process, the resist may be applied to the wafer substrate having the step.

In such a lithography process performed when the wafer substrate has the step, a dimension difference due to an exposure failure may occur in a pattern formed by an upper part of the step and a lower part of the step and cause a pattern formation failure. To eliminate such a pattern formation failure, it is necessary to extract a hot spot in a process from a pattern layout and correct the pattern layout or correct a photomask as required.

For example, in a mask pattern correcting method disclosed in Japanese Patent Application Laid-Open No. 2006-276491, a design mask pattern of a target layer and a step pattern formed in a layer under the target layer are extracted, a plurality of intersections where a transfer image of the design mask pattern and the step pattern cross are detected, and intersection distances among the intersections are calculated. In each of the intersections, a first treatment region including the intersection is set on an arrangement surface of the design mask pattern based on the intersection distances. A first transfer image of the design mask pattern transferred in the first treatment region is calculated based on the step pattern. The design mask pattern is corrected based on the first transfer image.

However, this correcting method is a method of extracting a region right above a step and correcting a mask pattern. When a hot spot occurs in a region other than the region right above the step, a position of the hot spot cannot be specified.

BRIEF SUMMARY OF THE INVENTION

In accordance with the present disclosure, there is provided a method of calculating a pattern-failure-occurrence region over a substrate having a plurality of step features. The pattern-failure-occurrence region is a region, over the substrate, where a subsequently formed feature is likely to fail to be properly formed due to an influence of the step features. The subsequently formed feature is formed by a subsequent lithography process performed after formation of the step features. The method comprises receiving a pattern layout determining the step features; receiving a correspondence relation between (1) a failure-occurrence risk at a position over the substrate and (2) a horizontal distance from the position to a step feature; receiving a predetermined condition defining proper formation of the subsequently formed feature; and calculating the pattern-failure-occurrence region based on the pattern layout, the correspondence relation, and the predetermined condition.

Also in accordance with the present disclosure, there is provided a non-transitory computer-readable storage medium storing a computer program product that, when executed, causes a computer to perform a method for calculating a pattern-failure-occurrence region over a substrate having a plurality of step features. The pattern-failure-occurrence region is a region, over the substrate, where a subsequently formed feature is likely to fail to be properly formed due to an influence of the step features. The subsequently formed feature is formed by a subsequent lithography process performed after formation of the step features. The method comprises receiving a pattern layout determining the step features; receiving a correspondence relation between (1) a failure-occurrence risk at a position over the substrate and (2) a horizontal distance from the position to a step feature; receiving a predetermined condition defining proper formation of the subsequently formed feature; and calculating the pattern-failure-occurrence region based on the pattern layout, the correspondence relation, and the predetermined condition.

Also in accordance with the present disclosure, there is provided a method of evaluating a pattern-layout using a pattern-failure-occurrence region over a substrate having a plurality of step features. The pattern-failure-occurrence region is a region, over the substrate, where a subsequently formed feature is likely to fail to be properly formed due to an influence of the step features. The subsequently formed feature is formed by a subsequent lithography process performed after formation of the step features. The method comprises receiving a first pattern layout determining the step features; receiving a correspondence relation between (1) a failure-occurrence risk at a position over the substrate and (2) a horizontal distance from the position to a step feature; receiving a predetermined condition defining proper formation of the subsequently formed feature; calculating the pattern-failure-occurrence region based on the first pattern layout, the correspondence relation, and the predetermined condition; comparing the pattern-failure-occurrence region and a second pattern layout determining the subsequently formed feature to thereby evaluate the second pattern layout; and extracting a pattern from the second pattern layout as a failure pattern, the extracted failure pattern corresponding to a subsequently formed feature that falls in the pattern-failure-occurrence-region.

Also in accordance with the present disclosure, there is provided a semiconductor-device manufacturing method using a pattern-failure-occurrence region over a substrate having a plurality of step features. The pattern-failure-occurrence region is a region, over the substrate, where a subsequently formed feature is likely to fail to be properly formed due to an influence of the step features. The subsequently formed feature is formed by a subsequent lithography process performed after formation of the step features. The method comprises receiving a first pattern layout determining the step features; receiving a correspondence relation between (1) a failure-occurrence risk at a position over the substrate and (2) a horizontal distance from the position to a step feature; receiving a predetermined condition defining proper formation of the subsequently formed feature; calculating the pattern-failure-occurrence region based on the pattern layout, the correspondence relation, and the predetermined condition; comparing the pattern-failure-occurrence region and a second pattern layout determining the subsequently formed feature to thereby evaluate the second pattern layout; extracting a pattern from the second pattern layout as a failure pattern, the extracted failure pattern corresponding to a subsequently formed feature that falls in the pattern-failure-occurrence-region; correcting a layout of the failure pattern; and manufacturing a semiconductor device using the corrected layout.

DETAILED DESCRIPTION OF THE INVENTION

Exemplary embodiments of the present invention are explained in detail below with reference to the accompanying drawings. The present invention is not limited by the embodiments. In the embodiments, both a pattern layout on design data and a pattern layout on mask data of a semiconductor circuit are explained as a pattern layout. Therefore, as the pattern layout, the pattern layout on the design data can be used or the pattern layout on the mask data can be used.

Figure 1:
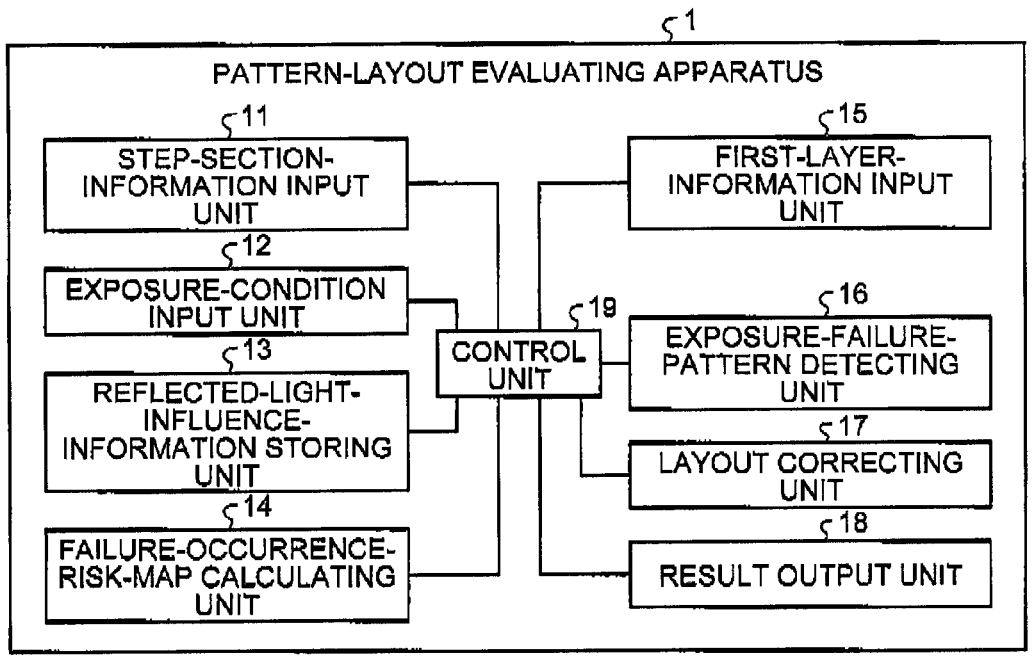
FIG. 1 is a functional block diagram of a pattern-layout evaluating apparatus according to an embodiment of the present invention.

FIG. 1 is a functional block diagram of a pattern-layout evaluating apparatus according to an embodiment of the present invention. A pattern-layout evaluating apparatus 1 is an apparatus that extracts a hot spot (a region in which an abnormal pattern) caused by halation due to a step and evaluates, using the extracted hot spot, a pattern layout of an exposure mask used for subsequent pattern formation. The pattern-layout evaluating apparatus 1 creates a map concerning a failure occurrence risk (possibility of occurrence of abnormality) of a resist pattern (a failure occurrence risk map) as a hot spot. As evaluation of a pattern layout, the pattern-layout evaluating apparatus 1 verifies whether a resist pattern as an evaluation target pattern causes a pattern formation failure (whether the evaluation target pattern cannot satisfy a predetermined condition). The pattern-layout evaluating apparatus 1 extracts a region a predetermined distance apart from a pattern (a gate electrode, etc.), in which a step section (convex section) (bump) is formed, as a region that could be a hot spot during evaluation target pattern formation.

The pattern-layout evaluating apparatus 1 includes a step-section-information input unit 11, an exposure-condition input unit 12, a reflected-light-influence-information storing unit 13, a failure-occurrence-risk-map calculating unit 14, a first-layer-information input unit 15, an exposure-failure-pattern detecting unit 16, a layout correcting unit 17, a result output unit 18, and a control unit 19.

The step-section-information input unit 11 receives input of information (step section information) concerning a pattern (a step pattern) formed earlier on a wafer substrate. The step pattern is, for example, a step pattern formed on a lower layer side or a pattern formed in a layer at the same height as an evaluation target pattern. The step pattern is formed before the evaluation target pattern is formed. The step section information includes information concerning a pattern layout (a design layout or a mask layout) of the step pattern and information concerning process conditions. The process conditions include the height of the step pattern and information (e.g., an optical constant) concerning a material of the step pattern. The step-section-information input unit 11 sends the step section information to the failure-occurrence-risk-map calculating unit 14. The step section information is not limited to the step pattern and can be, for example, information concerning a layout of an embedded oxide film (STI) formed on the water substrate.

The exposure-condition input unit 12 receives input of information concerning exposure conditions in forming evaluation target patterns (hereinafter, "first layer patterns") formed after the step pattern. The exposure conditions include illumination conditions such as an exposure amount, an exposure wavelength, and an illumination shape, an optical constant of a resist material, information concerning presence or absence of bottom antireflective coating (BARC), and information concerning an optical characteristic of the BARC. The exposure-condition input unit 12 sends the exposure conditions to the failure-occurrence-risk-map calculating unit 14.

The reflected-light-influence-information storing unit 13 stores information (reflected light influence information) concerning reflected light reflected on a side (a convex-shaped side) of the step pattern when exposure light is irradiated via photomask of the first layer patterns. The reflected light influence information includes information concerning interference of reflected light. The reflected light influence information is created based on the exposure conditions and the process conditions. The reflected light influence information is information (correspondence relation information) indicating a correspondence relation between a distance from the step pattern and a failure occurrence risk (an occurrence probability of a hot spot) (information concerning possibility of an exposure failure region). The reflected light influence information can be a function indicating the correspondence relation or can be a distribution model of the correspondence relation. The reflected light influence information is represented as, for example, a function of the failure occurrence risk having a peak at a predetermined distance (a distance where the influence of the reflected light is maximized) from the step pattern.

The failure-occurrence-risk-map calculating unit 14 calculates a failure occurrence risk map (an exposure failure region) using the reflected light influence information, the exposure conditions, and the step section information. The failure occurrence risk map is a map (a first pattern formation failure region) (a numerical value distribution) that indicates a hot spot (a region where the influence of the reflected light is maximized) during first layer pattern formation caused by a step (a sidewall surface, etc.) of the step pattern. The failure-occurrence-risk-map calculating unit 14 calculates the failure occurrence risk map by applying a convolutional operation of the reflected light influence information to the pattern layout of the step pattern.

The first-layer-information input unit 15 receives input of information (first layer information) concerning the first layer patterns. The first layer information includes information concerning a pattern layout of the first layer patterns. The exposure-failure-pattern detecting unit 16 detects, based on the first layer information and the failure occurrence risk map, a first layer pattern in which an exposure failure occurs among the first layer patterns. The first layer pattern in which an exposure failure occurs is, for example, a collapsing pattern of a resist pattern such as a pillar pattern, a pattern larger than a predetermined dimension, or a pattern smaller than the predetermined dimension.

The layout correcting unit 17 corrects a layout of the first layer pattern that is determined as an exposure failure pattern. The layout correcting unit 17 corrects the layout of the first layer pattern to prevent the first layer pattern after the correction of the layout from being determined as the exposure failure pattern. The layout correcting unit 17 can correct all the first layer patterns or can correct only the exposure failure pattern.

The result output unit 18 displays or outputs to the outside the failure occurrence risk map calculated by the failure-occurrence-risk-map calculating unit 14, the exposure failure pattern detected by the exposure-failure-pattern detecting unit 16, and the layout of the first layer patterns corrected by the layout correcting unit 17.

The control unit 19 controls the step-section-information input unit 11, the exposure-condition input unit 12, the reflected-light-influence-information storing unit 13, the failure-occurrence-risk-map calculating unit 14, the first-layer-information input unit 15, the exposure-failure-pattern detecting unit 16, the layout correcting unit 17, and the result output unit 18.

Figure 2:
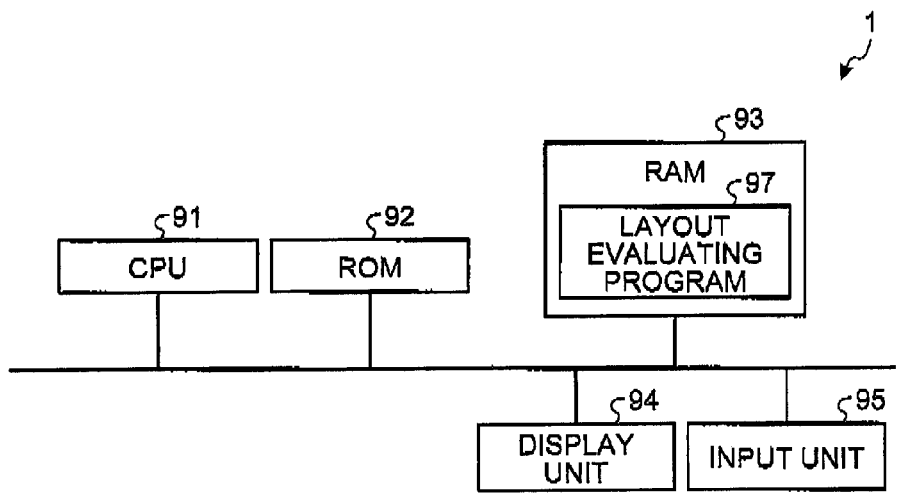
FIG. 2 is a diagram of a hardware configuration of the pattern-layout evaluating apparatus according to the embodiment.

FIG. 2 is a diagram of a hardware configuration of the pattern-layout evaluating apparatus according to this embodiment. The pattern-layout evaluating apparatus 1 includes a central processing unit (CPU) 91, a read only memory (ROM) 92, a random access memory (RAM) 93, a display unit 94, and an input unit 95. In the pattern-layout evaluating apparatus 1, the CPU 91, the ROM 92, the RAM 93, the display unit 94, and the input unit 95 are connected via a bus line.

The CPU 91 evaluates a pattern layout of an integrated circuit using a layout evaluating program 97, which is a computer program for performing evaluation and the like of a pattern layout. The layout evaluating program 97 is a program for performing calculation of a failure occurrence risk map (a pattern formation failure region) (a pattern failure occurrence region), evaluation of a pattern layout, correction of the pattern layout, and the like. The display unit 94 is a display device such as a liquid crystal monitor and displays, based on an instruction from the CPU 91, various kinds of information in evaluating a pattern layout (step section information, exposure conditions, reflected light influence information, a failure occurrence risk map, an exposure failure pattern, a corrected layout of first layer patterns, etc.). The input unit 95 includes a mouse and a keyboard and receives input of instruction information externally input from a user. The instruction information input to the input unit 95 is sent to the CPU 91.

The layout evaluating program 97 is stored in the ROM 92 and loaded to the RAM 93 via the bus line. The CPU 91 executes the layout evaluating program 97 loaded to the RAM 93. Specifically, in the pattern-layout evaluating apparatus 1, according to instruction input from the input unit 95 by the user, the CPU 91 reads out the layout evaluating program 97 from the ROM 92, expands the layout evaluating program 97 in a program storage area in the RAM 93, and executes various kinds of processing. The CPU 91 temporarily stores various data generated in the processing in a data storage area formed in the RAM 93.

The layout evaluating program 97 executed in the pattern-layout evaluating apparatus 1 according to this embodiment has a module configuration including the units explained above (the step-section-information input unit 11, the exposure-condition input unit 12, the reflected-light-information storing unit 13, the failure-occurrence-risk-map calculating unit 14, the first-layer-information input unit 15, the exposure-failure-pattern detecting unit 16, the layout correcting unit 17, the result output unit 18, and the control unit 19). When the units are loaded to a main storage device, the units are generated on the main storage device.

The layout evaluating program 97 executed in the pattern-layout evaluating apparatus 1 according to this embodiment can be stored on a computer, which is connected to a network such as the Internet, and provided by being downloaded through the network. The layout evaluating program 97 executed in the pattern-layout evaluating apparatus 1 according to this embodiment can be provided or distributed through the network such as the Internet. The layout evaluating program 97 according to this embodiment can be incorporated in a ROM or the like in advance and provided to the pattern-layout evaluating apparatus 1.

The layout evaluating program 97 can be a program for performing only calculation of a failure occurrence risk map or can be a program for performing only calculation of a failure occurrence risk map and evaluation of a pattern layout.

Figure 3:
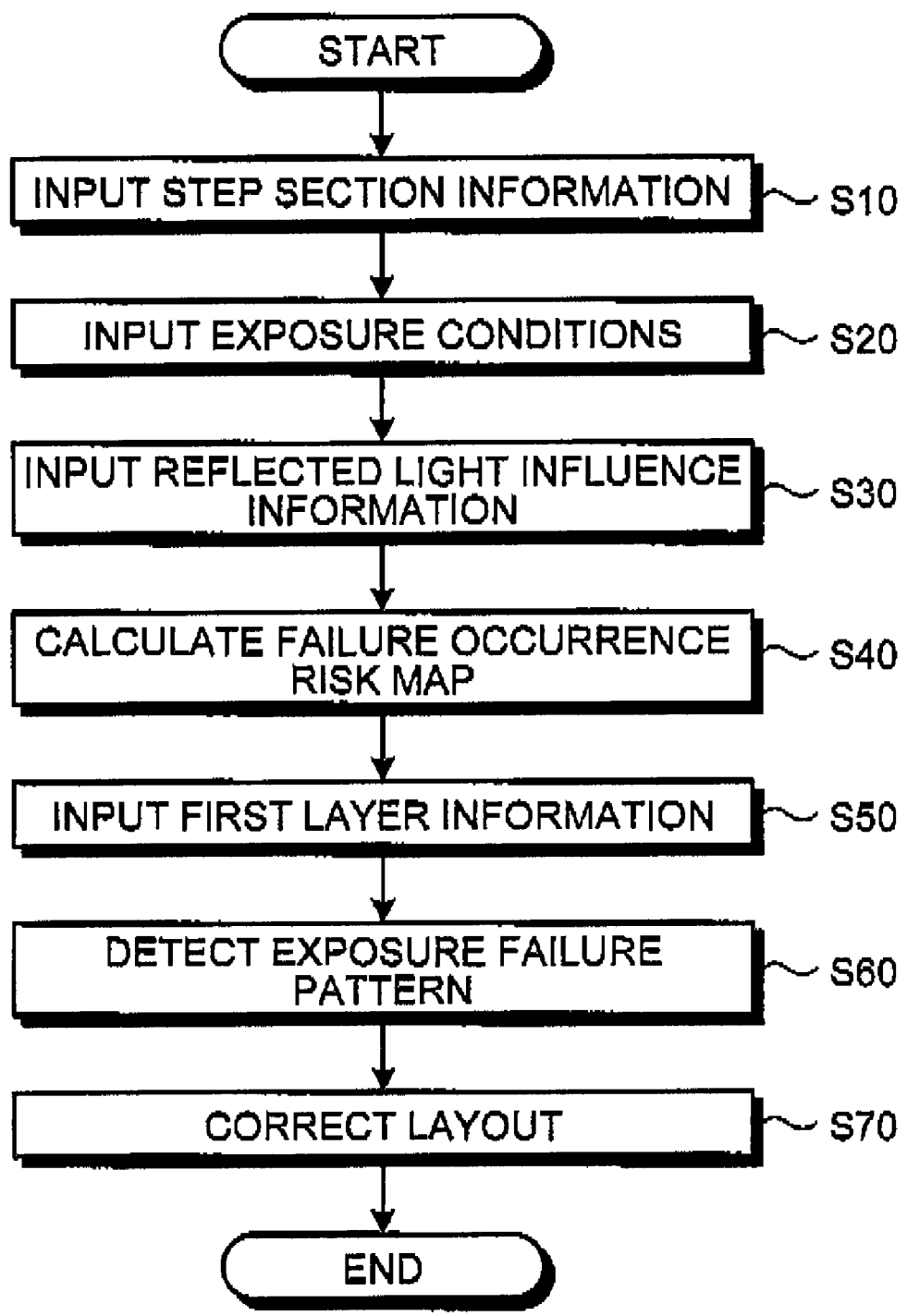
FIG. 3 is a flowchart of an operation procedure of the pattern-layout evaluating apparatus.

FIG. 3 is a flowchart of an operation procedure of the pattern-layout evaluating apparatus 1. Step section information is input to the step-section-information input unit 11 of the pattern-layout evaluating apparatus 1 (step S10). The step section information includes information concerning a pattern layout of a step pattern, information concerning pattern height of the step pattern, and information concerning a material of the step pattern. The step-section-information input unit 11 sends the step section information to the failure-occurrence-risk-map calculating unit 14.

Exposure conditions in forming first layer patterns are input to the exposure-condition input unit 12 (step S20). The exposure conditions include an exposure amount, an exposure wavelength, an illumination condition, and an optical constant of a resist material. The exposure-condition input unit 12 sends the exposure conditions to the failure-occurrence-risk-map calculating unit 14. Reflected light influence information is input to the reflected-light-influence-information storing unit 13 (step S30). The reflected-light-influence-information storing unit 13 stores the reflected light influence information.

Thereafter, the failure-occurrence-risk-map calculating unit 14 starts calculation of a failure occurrence risk map using the reflected light influence information, the exposure conditions, and the step section information. A specific example of a wafer substrate for which a failure occurrence risk map is calculated is explained.

Figure 4:
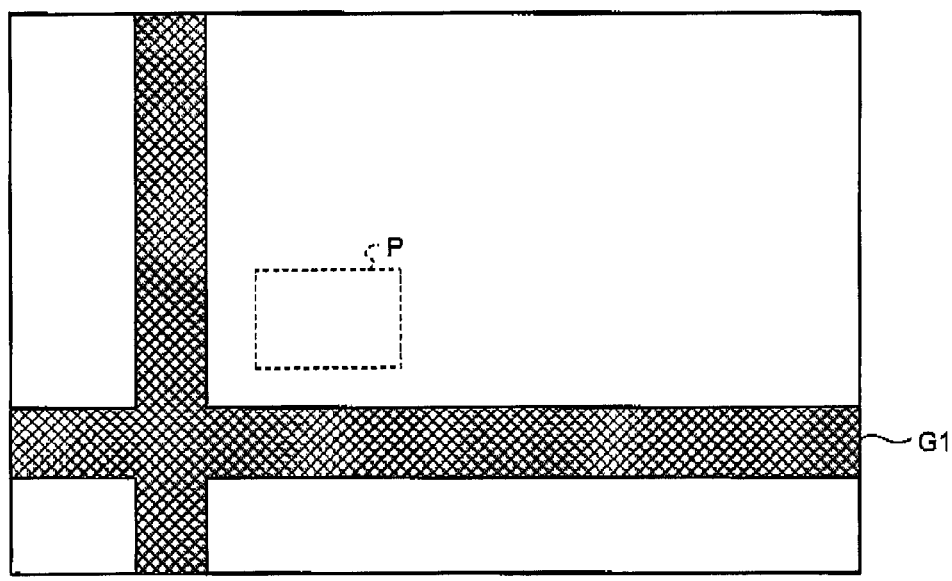
FIG. 4 is a diagram of an example of a pattern layout as a target of calculation of a failure occurrence risk map.

FIG. 4 is a diagram of an example of a pattern layout for which a failure occurrence risk map is calculated. In FIG. 4, the pattern layout for which a failure occurrence risk map is calculated (a layer that causes a step) is a pattern layout of a gate G1. FIG. 4 is a top view of the pattern layout. The gate G1 is hatched.

The gate G1 is arranged as a line pattern in the vertical and horizontal directions in a pattern layout surface. The gate G1 is formed on the wafer substrate according to this arrangement. After the gate G1 is formed on the wafer substrate, when a resist is applied to an upper layer section of the gate G1 to perform exposure treatment for first layer patterns, exposure light is reflected on a sidewall surface or the like of the gate G1. Specifically, when a lithography process for the first layer patterns is performed in a state in which the wafer substrate has a step, the exposure light is reflected on a convex shape side of a gate electrode or the like depending on an exposure wavelength, an illumination condition, an optical constant of a resist material, an optical constant of a gate electrode material, and the like. Even a region shielded from light by an exposure mask in a region on the wafer substrate has exposure light intensity close to that of a region not shielded from light. As a result, a desired pattern may not be formed in the first layer patterns. Such a pattern formation failure is caused by the reflection of the exposure light due to a sectional shape (irregularity) of the wafer substrate (the step pattern).

Therefore, interference of the reflected light on the convex side or the like depends on exposure conditions, process conditions, and pattern arrangement. A position a predetermined distance apart from the step pattern could be a hot spot (a region where a resist tends to topple, etc.). In other words, when the reflected light on the step pattern condenses and interferes in a position a predetermined distance apart from the gate G1, a pattern failure may occur in the first layer patterns. When the reflected light affects predetermined positions of the first layer patterns (exposed mask patterns) because of step shapes in a plurality of places, the influence by the reflected light is extremely conspicuous.

In the past, a pattern failure due to a step shape is solved by extracting a hot spot in a process from a layout and correcting the layout or correcting a mask as required. However, in the method in the past, the hot spot is only extracted in a region right above a step. A pattern failure due to reflected light cannot be solved. Therefore, in this embodiment, regions where pattern failures occur in the first layer patterns because the influence of a step shape in the step pattern extends to a remote position are included in a failure occurrence risk map.

The failure-occurrence-risk-map calculating unit 14 calculates a failure occurrence risk map by applying a convolutional operation of reflected light influence information to a pattern layout of the step pattern (step S40). In other words, to calculate a hot spot caused by a base structure in a position a predetermined distance from the base structure, the pattern-layout evaluating apparatus 1 performs a convolutional operation of a function or the like that indicates a correspondence relation between a mask layout used for formation of a base and an occurrence probability of the hot spot.

Figure 5:
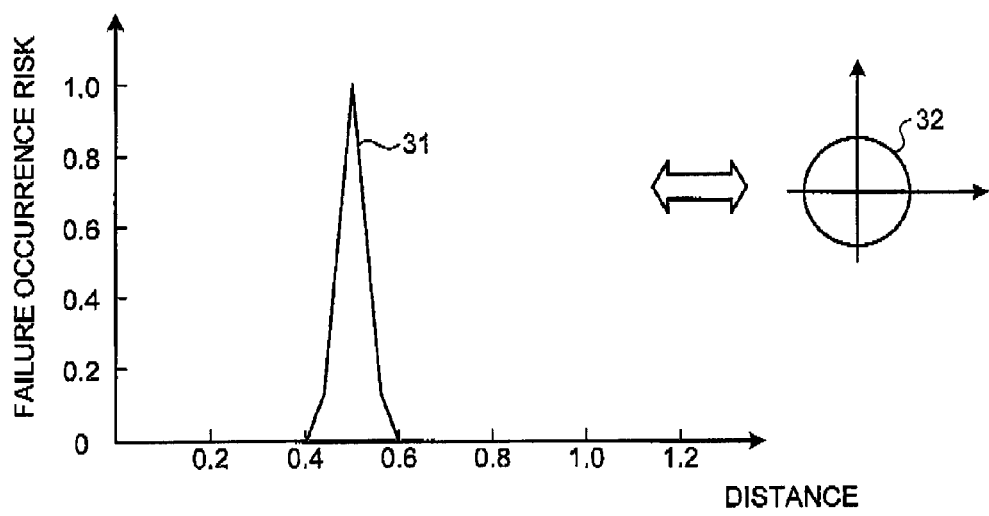
FIG. 5 is a graph for explaining an example of reflected light influence information.

FIG. 5 is a graph for explaining an example of reflected light influence information. In FIG. 5, the reflected light influence information is a function (a radial function 31) that indicates a correspondence relation between a distance from the step pattern and a failure occurrence risk (influence on a process). For example, as shown in FIG. 5, in the radial function 31, the failure occurrence risk has a peak at a predetermined distance (0.5 micrometer) from the step pattern. In this way, influence on an exposure pattern of a first layer due to halation by exposure light during exposure of the first layer patterns is the strongest in a position, for example, about 0.5 micrometer apart from a gate pattern. This is clarified by a prior evaluation test or lithography simulation employing an FDTD method.

Distribution information (a distribution function) 32 of the failure occurrence risk corresponding to the radial function 31 changes according to a distance from the step pattern. The distribution information 32 indicates a circular distribution in which the level of the failure occurrence risk is distributed in a concentric circular shape. For example, when a target of creation of a failure occurrence risk map is a layer below pillar patterns or a layer same as a layer of the pillar patterns, the radial function 31 is a pattern collapse function of the pillar patterns (a correspondence relation between a distance from the step pattern and collapse possibility of the pillar patterns).

The radial function 31 and the distribution information 32 shown in FIG. 5 are those obtained, for example, when an illumination shape is normal illumination. Illumination shapes other than the normal illumination includes annular illumination, quadruple illumination (four-pole illumination), and dipole illumination (two-pole illumination). In this embodiment, the failure occurrence risk map is calculated by using the radial function 31 and the distribution information 32 corresponding to an illumination shape.

Figure 6:
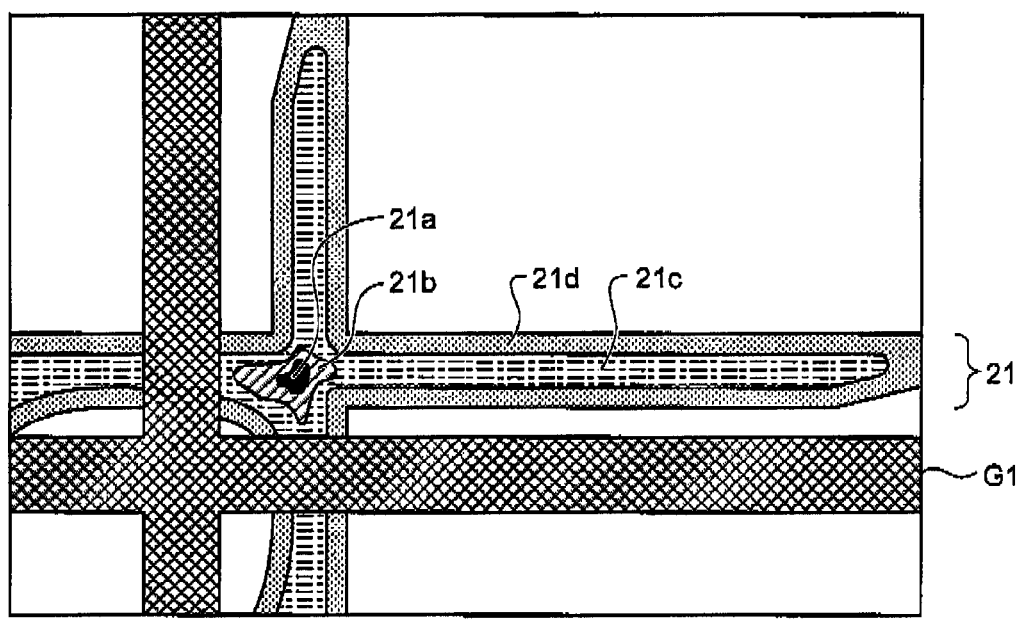
FIG. 6 is a diagram of an example of a failure occurrence risk map.

FIG. 6 is a diagram of an example of the failure occurrence risk map. In FIG. 6, a failure occurrence risk map 21 calculated with respect to the pattern layout shown in FIG. 4 is shown. In FIG. 6, the gate G1 and regions 21a to 21b indicating risks of failure occurrence are hatched. In the failure occurrence risk map 21, the region 21a, the region 21b, the region 21c, and the region 21d are shown in order according to an increase in the risk of failure occurrence (the collapse possibility of the pillar patterns, etc.) when the first layer patterns are formed.

Subsequently, the first layer information is input to the first-layer-information input unit 15 (step S50). The exposure-failure-pattern detecting unit 16 detects, based on the first layer information and the failure occurrence risk map, a first pattern in which an exposure failure occurs among first layer patterns (resist patterns). In other words, the exposure-failure-pattern detecting unit 16 extracts a pattern arranged in a region corresponding to a hot spot from a mask layout for exposure of the first layer patterns.

A specific example of a first layer pattern as an evaluation target for evaluating whether an exposure failure occurs is explained. FIGS. 7A to 7D, FIGS. 8A to 8F, and FIGS. 3A to 9E are diagrams for explaining first layer patterns as an evaluation target. FIGS. 7A to 7D are schematic diagrams (sectional views) of an example of pattern formation performed when the first layer patterns as evaluation targets are pillar patterns. The pillar patterns are resist patterns used in ion implantation after gate formation.

Figure 7A:
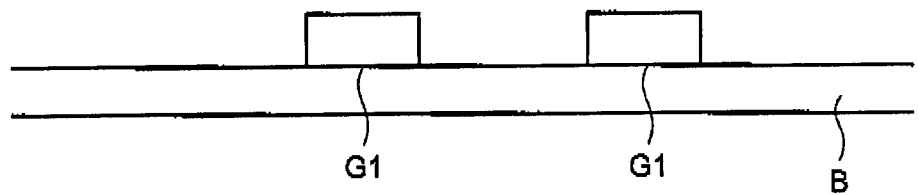
FIGS. 7A to 7D are schematic diagrams of an example of pattern formation performed when first layer patterns as evaluation targets are pillar patterns.
Figure 7B:
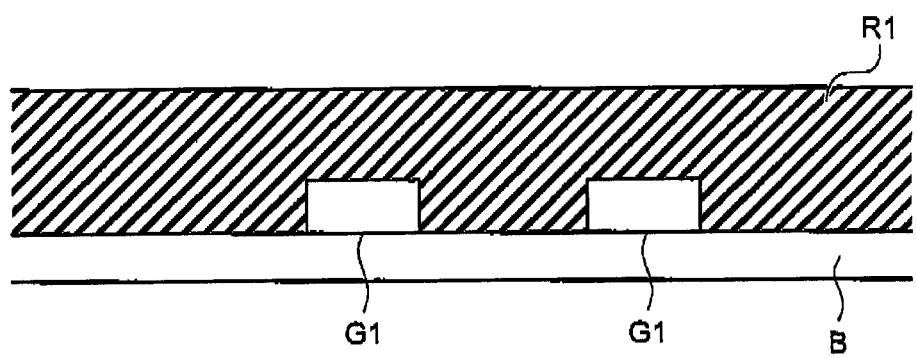
Figure 7C:
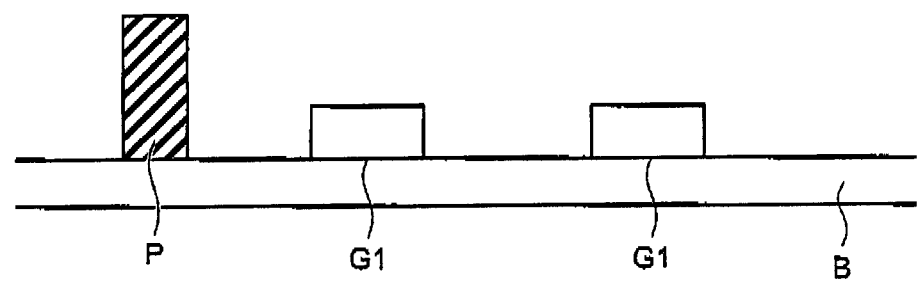
Figure 7D:
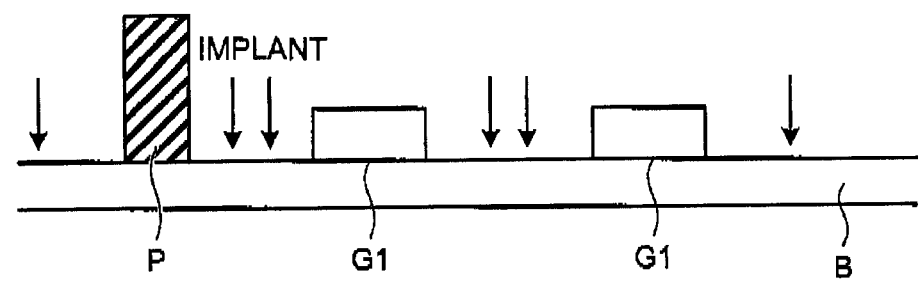

After a pattern of the gate G1 having height of about 300 nanometers is formed on a wafer substrate B (FIG. 7A), a resist (a first film) R1 is applied over the gate G1 and the wafer substrate B (FIG. 7B). Thereafter, exposure treatment for the wafer substrate B is performed. A pillar pattern P having height of about 900 nanometers is formed as a resist pattern of the first layer pattern (a first pattern) (FIG. 7C). The pillar pattern P is formed in a position a distance of about 400 nanometers apart from the gate G1. Ion implantation in the wafer substrate B is performed with the pillar pattern P and the gate G1 as masks (FIG. 7D).

The pattern-layout evaluating apparatus 1 according to this embodiment sets, for example, the pillar pattern P formed in the treatment shown in FIG. 7C as an evaluation target for evaluating whether an exposure failure occurs. Specifically, the pattern-layout evaluating apparatus 1 evaluates a pattern layout by determining whether the pillar pattern P collapses.

As the first layer pattern as an evaluation target, there is a resist pattern (a second resist pattern) formed in a second time of a double exposure process. The double exposure process includes a first double exposure process including two times of exposure treatment and two times of machining treatment (etching treatment) and a second double exposure process including two times of exposure treatment and one time of machining treatment (etching treatment).

Figure 8A:
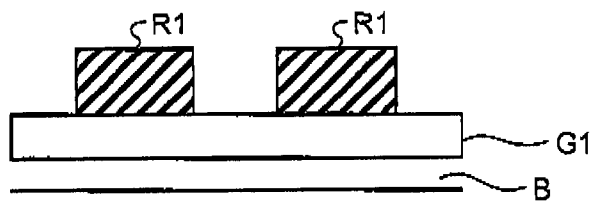
FIGS. 8A to 8F are diagrams for explaining second resist patterns formed in a first double exposure process.

FIGS. 8A to 8F are diagrams (a schematic sectional view of a pattern formation example) for explaining second resist patterns formed in the first double exposure process as first layer patterns as evaluation targets. After a film of the gate G1 is stacked on the wafer substrate B, first resist patterns (resists R1) as resist patterns in a first time is formed on the film of the gate G1 (FIG. 8A).

Figure 8B:
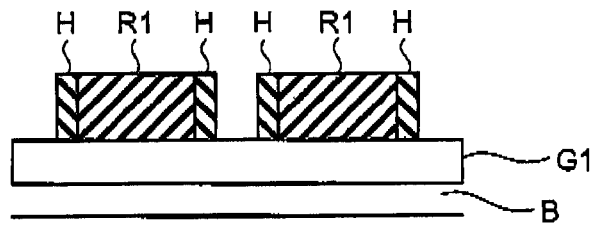
Figure 8C:
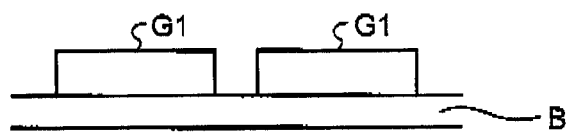

Thereafter, heat treatment for the resists R1 is performed as a Relacs process, whereby thermosetting layers H are formed in outer circumferences of the resists R1 (FIG. 8B). The gate G1 is patterned with the resists R1 and the thermosetting layers H as masks (FIG. 8C).

Resists R2 are applied over the gate G1 and the wafer substrate B as resists in a second time. Thereafter, exposure treatment for the wafer substrate B is performed and patterns of the resists R2 are formed as resist patterns corresponding to first layer patterns. The patterns of the resists R2 are patterned to cover a portion of the gate G1 and expose the other portions of the gate G1 (FIG. 5D).

Thereafter, heat treatment for the resists R2 is performed as a Relacs process, whereby the thermosetting layers H are formed in outer circumferences of the resists R2 (FIG. 5E). The gate G1 is patterned again with the resists R2 and the thermosetting layers H as masks (FIG. 8F).

Figure 8D:
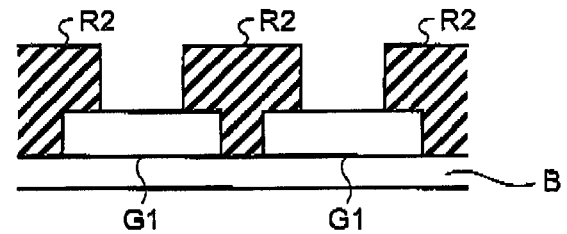
Figure 8E:
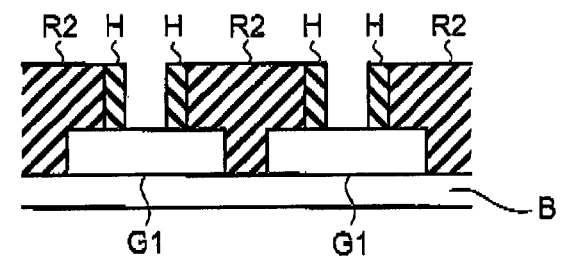
Figure 8F:
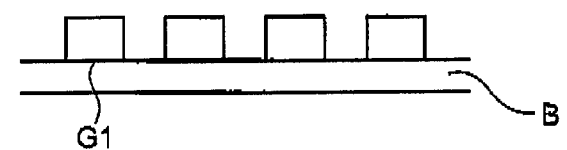

The pattern-layout evaluating apparatus 1 according to this embodiment sets, for example, patterns of the resists R2 formed in the treatment shown in FIG. 8D as evaluation targets for evaluating whether an exposure failure occurs. Specifically, the pattern-layout evaluating apparatus 1 evaluates a pattern layout by determining whether a pattern dimension of the resists R2 is smaller than a predetermined dimension or larger than the predetermined dimension. The Relacs process performed in the processing shown in FIG. 8B can be omitted.

Figure 9A:
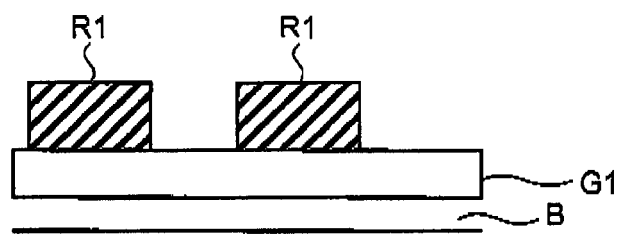
FIGS. 9A to 9E are diagrams for explaining second resist patterns formed in a second double exposure process.

FIGS. 9A to 9E are diagrams (a schematic sectional view of a pattern formation example) for explaining second resist patterns formed in the second double exposure process as first layer patterns as evaluation targets. After a film of the gate G1 is stacked on the wafer substrate B, patterns of the resists R1 as resist patterns in the first time are formed on the film of the gate G1 (FIG. 9A).

Figure 9B:
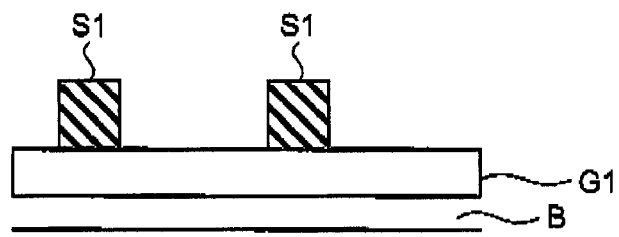

Thereafter, for example, isotropic dry etching or the like for the resists R1 is performed as resist slimming, whereby slimmed resists (slimming resists S1) are formed (FIG. 9B).

Figure 9C:
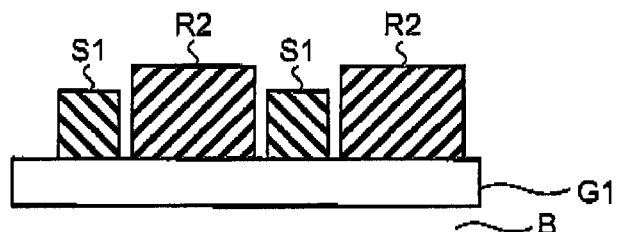
Figure 9D:
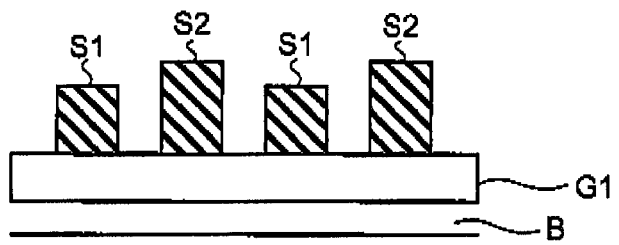
Figure 9E:
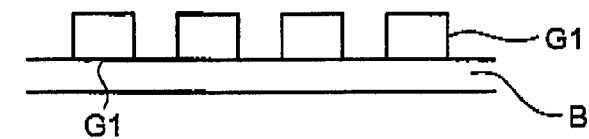

Further, the resists R2 as resist patterns in the second time are formed on the film of the gate G1 (FIG. 9C). Resist slimming for the resists R2 is performed, whereby slimmed resists (slimming resists S2) are formed (FIG. 5D). Thereafter, the gate G1 is patterned with the slimming resists S1 and S2 as masks (FIG. 9E).

The pattern-layout evaluating apparatus 1 according to this embodiment sets, for example, the patterns of the resists R2 formed in the processing shown in FIG. 9C as evaluation targets for evaluating whether an exposure failure occurs. Specifically, the pattern-layout evaluating apparatus 1 evaluates a pattern layout by determining whether a pattern dimension of the resists R2 is smaller than the predetermined dimension or larger than the predetermined dimension. The resist slimming performed in the processing shown in FIGS. 9B and 9D can be omitted.

If a pattern on a mask used during exposure of first layer patterns is present on the failure occurrence risk map 21, the pattern has possibility of collapse or loss of a resist pattern during the exposure. Therefore, the exposure-failure-pattern detecting unit 16 superimposes a layout of first layer patterns on the failure occurrence risk map 21 and compares the layouts with the failure occurrence risk map 21 to thereby determine whether an exposure failure occurs in the first layer patterns and detects a pattern (a failure pattern) in which an exposure failure occurs among the first layer patterns. For example, when first layer patterns as evaluation targets are pillar patterns P, the exposure-failure-pattern detecting unit 16 detects and extracts the pillar pattern P having a probability of collapse higher than a predetermined value as an exposure failure pattern.

In extracting the exposure failure pattern, the exposure-failure-pattern detecting unit 16 calculates, as an evaluation value, for example, a product of a numerical value distribution of the failure occurrence risk map 21 and a numerical value distribution obtained by binarizing the mask layout for exposure of the first layer patterns. The exposure-failure-pattern detecting unit 16 extracts a pattern having the evaluation value exceeding a reference threshold set in advance as a pattern with a high exposure failure risk (an exposure failure pattern).

In extracting an exposure failure pattern, the exposure-failure-pattern detecting unit 16 can convert the numerical value distribution of the failure occurrence risk map 21 into a contour line of the reference threshold set in advance and convert the contour line into layout information. In this case, the exposure-failure-pattern detecting unit 16 compares, according to graphic data processing, the contour line converted into the layout information and a pattern layout of first layer patterns and extracts an exposure failure pattern based on a comparison result.

The reference threshold used by the exposure-failure-pattern detecting unit 16 in extracting an exposure failure pattern is set such that, for example, a pattern corresponding to an exposure failure pattern when a prior test or simulation is performed is extracted as an exposure failure pattern detected by the exposure-failure-pattern detecting unit 16.

Figure 10:
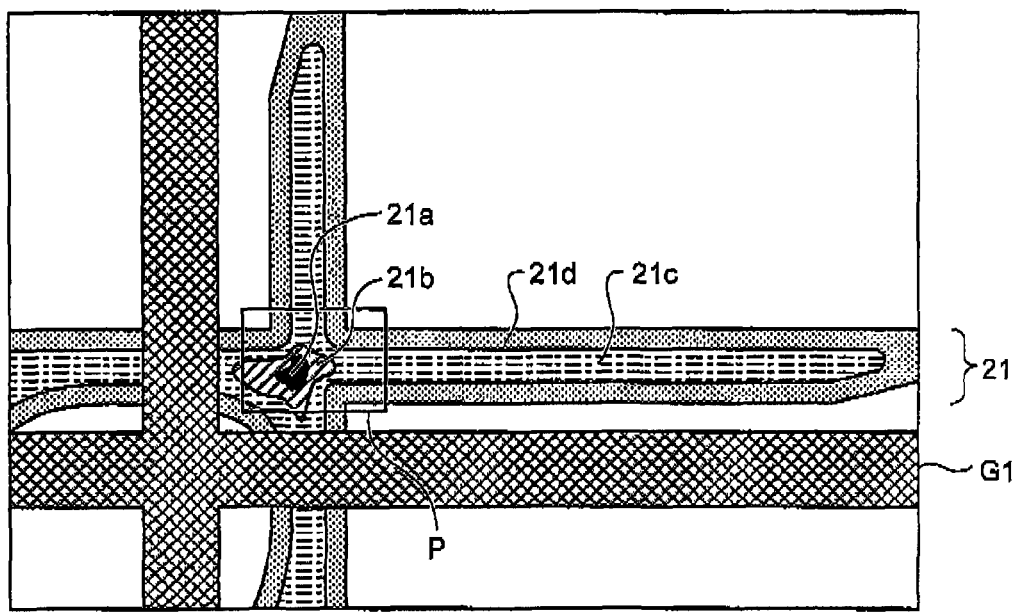
FIG. 10 is a diagram for explaining processing for determining whether a pillar pattern collapses.

FIG. 10 is a diagram for explaining processing for determining whether a pillar pattern collapses. In FIG. 10, the gage G1 and the regions 21a to 21d are hatched. When the first layer patterns are the pillar patterns P, the exposure-failure-pattern detecting unit 16 calculates, for each of the pillar patterns P, a probability that the pillar pattern P collapses. The exposure-failure-pattern detecting unit 16 calculates, based on a ratio of an area overlapping the failure occurrence risk map 21 in the pillar pattern F, a probability that the pillar pattern P collapses. The exposure-failure-pattern detecting unit 16 can weight each risk of failure occurrence (in regions 21a to 21d) to calculate a probability that the pillar pattern P collapses. When the probability that the pillar pattern P collapses is equal to or larger than a predetermined value, the exposure-failure-pattern detecting unit 16 determines that the pillar pattern P collapses.

The layout correcting unit 17 corrects a layout of a first layer pattern determined as an exposure failure pattern (step S70). The layout correcting unit 17 corrects the layout of the first layer pattern such that the first layer pattern after the correction of the layout is determined as not an exposure failure pattern.

Figure 11:
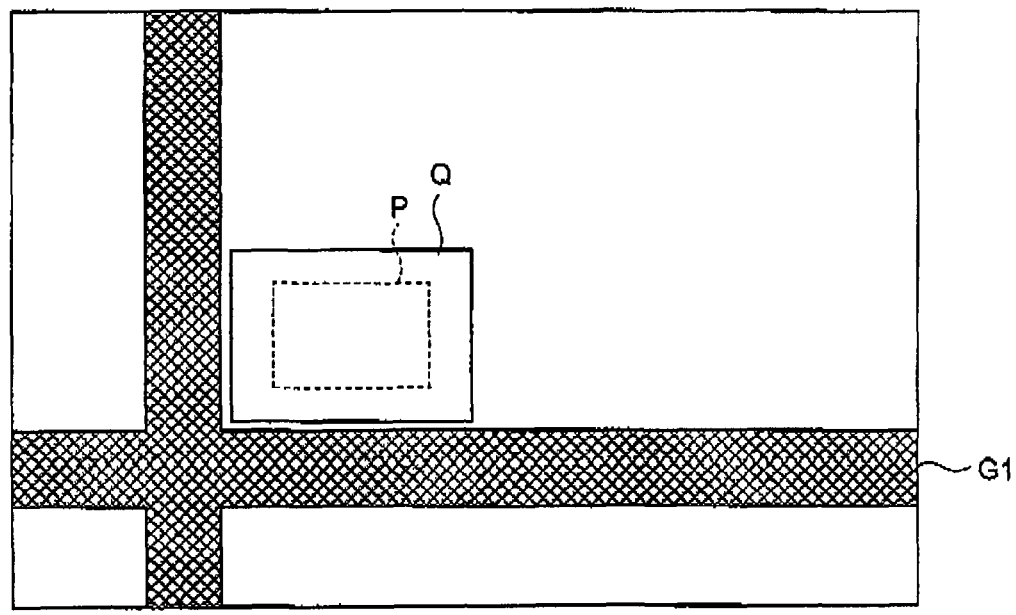
FIG. 11 is a diagram for explaining a method of correcting a pattern layout.

FIG. 11 is a diagram for explaining a method of correcting a pattern layout. In FIG. 11, the gate G1 is hatched. The layout correcting unit 17 corrects a layout of a first layer pattern by, for example, increasing an area of the pillar pattern P. Consequently, the pillar pattern P is corrected to a pillar pattern Q having an area lager than the pillar pattern P. Thereafter, an exposure mask is created by using the corrected first layer pattern and a semiconductor device is manufactured by using the exposure mask. When the semiconductor device is manufactured by using the exposure mask, a pattern corresponding to the corrected first layer pattern is transferred onto a wafer by using the exposure mask to perform pattern formation. Specifically, exposure treatment is performed by using the exposure mask and, after the exposure treatment, a pattern is formed on the wafer by development treatment, etching treatment, film formation treatment, and the like. These kinds of pattern formation treatment are repeated for each layer to manufacture a semiconductor device on a substrate.

When the first layer pattern is a pattern layout on design data, a design pattern is created by using the corrected first layer pattern. An exposure mask is created by using the created design pattern and a semiconductor device is manufactured by using the exposure mask.

In the explanation of this embodiment, the respective kinds of information are input to the pattern-layout evaluating apparatus 1 in order of the step section information, the exposure conditions, and the reflected light influence information. However, these kinds of information can be input in any order. Further, in the explanation of this embodiment, after the failure occurrence risk map 21 is calculated, the first layer information is input to the pattern-layout evaluating apparatus 1. However, the first layer information can be input to the pattern-layout evaluating apparatus 1 before the failure occurrence risk map 21 is calculated. In this case, the step section information, the exposure conditions, the reflected light influence information, and the first layer information can be input to the pattern-layout evaluating apparatus 1 in any order.

In the explanation of this embodiment, the layout correcting unit 17 corrects a step pattern. However, the layout correcting unit 17 can correct a first layer pattern. Further, in the explanation of this embodiment, the pattern layout is corrected. However, a process such as the exposure conditions can be changed.

The step pattern and the first layer pattern as evaluation targets can be layers other than those explained with reference to FIGS. 7A to 9E. For example, the failure occurrence risk map can be created by using shallow trench isolation (STI) instead of the step pattern. The layout evaluation can be performed by using a gate electrode as the first layer pattern.

The failure occurrence risk map is not always created for one step pattern. The failure occurrence risk map can be created based on a plurality of step patterns. Information (e.g., an optical constant) concerning an interlayer film stacked between the step pattern and the first layer pattern can be included in the step section information together with the information concerning the material of the step pattern.

The failure occurrence risk map is not limited to the map of an exposure failure in the resist pattern of the first layer pattern. The failure occurrence risk map can be a map of pattern abnormality of the first layer pattern itself after etching.

In the explanation of this embodiment, the pattern-layout evaluating apparatus 1 calculates the failure occurrence risk map and performs the layout correction for the first layer pattern. However, the pattern-layout evaluating apparatus 1 can perform only the calculation of the failure occurrence risk map without performing the layout correction for the first layer pattern. In this case, the layout evaluating program 97 calculates the failure occurrence risk map. The pattern-layout evaluating apparatus 1 can perform the layout correction for the first layer pattern using the failure occurrence risk map created in advance. In this case, the layout evaluating program 97 performs the layout correction for the first layer pattern.

As explained above, according to this embodiment, the failure occurrence risk map is calculated based on the pattern layout of the step pattern. Therefore, an exposure failure region (a pattern formation failure region) in the first layer pattern due to the step pattern can be accurately calculated in a short time in a step pattern layout surface (an entire layout of a semiconductor product).

The evaluation and the layout correction for the first layer pattern layout are performed by using the failure occurrence risk map calculated based on the pattern layout of the step pattern. Therefore, it is possible to accurately evaluate in a short time whether an exposure failure region occurs in the first layer pattern because of the step pattern. Further, it is possible to correct the layout of the first layer pattern to prevent an exposure failure due to the step pattern from occurring.

The failure occurrence risk map is calculated based on the exposure conditions in forming the first layer pattern and the process conditions concerning the step pattern. Therefore, it is possible to accurately calculate an exposure failure region in the first layer pattern due to the step pattern.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A computer-implemented method of calculating a pattern-failure-occurrence region over a substrate having a plurality of step features, the pattern-failure-occurrence region being a region, over the substrate, where a subsequently formed feature is likely to fail to be properly formed due to an influence of the step features, the subsequently formed feature being formed by a subsequent lithography process performed after formation of the step features, the method comprising:

receiving a pattern layout determining the step features;
receiving a correspondence relation between (1) a failure-occurrence risk at a position over the substrate and (2) a horizontal distance from the position to a step feature;
receiving a predetermined condition defining proper formation of the subsequently formed feature; and
calculating, by a computer, the pattern-failure-occurrence region based on the pattern layout, the correspondence relation, and the predetermined condition.

2. The method according to claim 1, wherein the correspondence relation is created based on at least one of exposure conditions in the subsequent lithography process or process conditions concerning the subsequently formed feature.

3. The method according to claim 2, wherein the exposure conditions include at least one of an exposure amount, an exposure wavelength, an illumination condition, an optical constant of a resist material, information concerning presence or absence of BARC, or information concerning an optical characteristic of the BARC.

4. The method according to claim 2, wherein the process conditions include at least one of information concerning height of the step feature and information concerning a material of the step feature.

5. The method according to claim 1, wherein the correspondence relation is created based on information concerning reflected light reflected on a side of the step feature when exposure light is irradiated thereon via a photomask used in the subsequent lithography process.

6. The method according to claim 1, wherein the correspondence relation includes a function having a peak at a predetermined distance from the step feature.

7. The method according to claim 1, wherein the subsequently formed feature includes a resist pattern.

8. The method according to claim 7, wherein the resist pattern is formed in a second time in a double exposure process.

9. The method according to claim 1, wherein the subsequently formed feature includes a pattern after etching.

10. The method according to claim 1, wherein the step feature includes steps of a plurality of layers.

11. The method according to claim 1, wherein the correspondence relation is created by using information concerning an interlayer film stacked between the step feature and the subsequently formed feature.

12. The method according to claim 1, wherein the correspondence relation is created by using a design pattern layout on design data of the subsequently formed feature and a mask pattern layout on mask data of the subsequently formed feature.

13. A non-transitory computer-readable storage medium storing a computer program product that, when executed, causes a computer to perform a method for calculating a pattern-failure-occurrence region over a substrate having a plurality of step features, the pattern-failure-occurrence region being a region, over the substrate, where a subsequently formed feature is likely to fail to be properly formed due to an influence of the step features, the subsequently formed feature being formed by a subsequent lithography process performed after formation of the step features, the method comprising:
   receiving a pattern layout determining the step features;
   receiving a correspondence relation between (1) a failure-occurrence risk at a position over the substrate and (2) a horizontal distance from the position to a step feature;
   receiving a predetermined condition defining proper formation of the subsequently formed feature; and
   calculating the pattern-failure-occurrence region based on the pattern layout, the correspondence relation, and the predetermined condition.

14. A computer-implemented method of evaluating a pattern-layout using a pattern-failure-occurrence region over a substrate having a plurality of step features, the pattern-failure-occurrence region being a region, over the substrate, where a subsequently formed feature is likely to fail to be properly formed due to an influence of the step features, the subsequently formed feature being formed by a subsequent lithography process performed after formation of the step features, the method comprising:
   receiving a first pattern layout determining the step features;
   receiving a correspondence relation between (1) a failure-occurrence risk at a position over the substrate and (2) a horizontal distance from the position to a step feature;
   receiving a predetermined condition defining proper formation of the subsequently formed feature;
   calculating, by a computer, the pattern-failure-occurrence region based on the first pattern layout, the correspondence relation, and the predetermined condition;
   comparing, by a computer, the pattern-failure-occurrence region and a second pattern layout determining the subsequently formed feature to thereby evaluate the second pattern layout; and
   extracting, by a computer, a pattern from the second pattern layout as a failure pattern, the extracted failure pattern corresponding to a subsequently formed feature that falls in the pattern-failure-occurrence-region.

15. The method according to claim 14, further comprising correcting a layout of the failure pattern.

16. The method according to claim 14, further comprising correcting, based on the failure pattern, the first pattern layout.

17. The method according to claim 14, wherein the correspondence relation is created based on at least one of exposure conditions in the subsequent lithography process or process conditions concerning the subsequently formed feature.

18. The method according to claim 14, further comprising correcting at least one of the exposure conditions or the process conditions to eliminate the failure pattern.

19. The method according to claim 14, wherein the correspondence relation is created based on information concerning reflected light reflected on a side of the step feature when exposure light is irradiated thereon via a photomask used in the subsequent lithography process.

20. A semiconductor-device manufacturing method using a pattern-failure-occurrence region over a substrate having a plurality of step features, the pattern-failure-occurrence region being a region, over the substrate, where a subsequently formed feature is likely to fail to be properly formed due to an influence of the step features, the subsequently formed feature being formed by a subsequent lithography process performed after formation of the step features, the method comprising:
   receiving a first pattern layout determining the step features;
   receiving a correspondence relation between (1) a failure-occurrence risk at a position over the substrate and (2) a horizontal distance from the position to a step feature;
   receiving a predetermined condition defining proper formation of the subsequently formed feature;
   calculating, by a computer, the pattern-failure-occurrence region based on the pattern layout, the correspondence relation, and the predetermined condition;
   comparing, by a computer, the pattern-failure-occurrence region and a second pattern layout determining the subsequently formed feature to thereby evaluate the second pattern layout;
   extracting, by a computer, a pattern from the second pattern layout as a failure pattern, the extracted failure pattern corresponding to a subsequently formed feature that falls in the pattern-failure-occurrence-region;
   correcting a layout of the failure pattern; and
   manufacturing a semiconductor device using the corrected layout.

* * * * *